United States Patent [19]
Kim et al.

[11] Patent Number: 6,107,147
[45] Date of Patent: Aug. 22, 2000

[54] STACKED POLY/AMORPHOUS SILICON GATE GIVING LOW SHEET RESISTANCE SILICIDE FILM AT SUBMICRON LINEWIDTHS

[75] Inventors: Youngmin Kim, Plano; Shawn T. Walsh; Jaideep Mavoori, both of Richardson, all of Tex.

[73] Assignee: Texas Instruments Incorporated, Dallas, Tex.

[21] Appl. No.: 09/453,374

[22] Filed: Dec. 2, 1999

Related U.S. Application Data

[60] Provisional application No. 60/112,969, Dec. 18, 1998.

[51] Int. Cl.[7] .................................................. H01L 21/336
[52] U.S. Cl. ......................... 438/301; 438/482; 438/585; 438/657; 438/660
[58] Field of Search .................................... 438/197, 299, 438/301, 482, 585, 657, 660

[56] References Cited

U.S. PATENT DOCUMENTS 4,479,831 10/1984 Sandow et al. .
5,614,428 3/1997 Kapoor .
5,837,598 11/1998 Aronowitz et al. .

*Primary Examiner*—Long Pham
*Attorney, Agent, or Firm*—Jacqueline J. Garner; W. James Brady III; Frederick J. Telecky, Jr.

[57] ABSTRACT

A method of forming a poly-silicide gate electrode (102). The polysilicon deposition is broken into two steps. After the first polysilicon layer (102a) is formed, a very thin oxide (102b) is formed thereover. Polysilicon deposition then continues to form a second polysilicon layer (102c). The oxide layer (102b) inhibits grain growth resulting in a smaller grain size for the second polysilicon layer (102c). Prior to silicide formation, a pre-amorphization implant is performed to amorphize the second polysilicon layer (102c) and possibly some of the first polysilicon layer (102a) as well. Titanium is deposited and reacted with the polysilicon layers to form a silicide. The silicide process consumes the interface between polysilicon layers (102a & 102c) and possibly a portion of the first polysilicon layer (102a). The resulting silicide layer has a more uniform sheet resistance.

13 Claims, 3 Drawing Sheets

STACKED POLY/AMORPHOUS SILICON GATE GIVING LOW SHEET RESISTANCE SILICIDE FILM AT SUBMICRON LINEWIDTHS

This application claims priority under 35 USC 119(e)(1) of provisional application No. 60/112,969 filed Dec. 18, 1998.

FIELD OF THE INVENTION

The invention is generally related to the field of MOSFET transistors and more specifically to sub-micron MOSFET transistors having silicided gate electrodes.

BACKGROUND OF THE INVENTION

As semiconductor technology progresses, the resistance of polysilicon lines used to form gates of MOSFET transistors becomes unacceptably high. As a result, silicide (such as titanium silicide) is commonly added to the polysilicon lines to reduce the resistance. In a self-aligned (salicide) process, a layer of titanium is deposited over the structure and reacted in a nitrogen ambient at temperatures on the order of 650–750° C. The titanium layer reacts with the silicon of the polysilicon lines and/or the source/drain regions to form a titanium-silicide layer and with the nitrogen ambient to form a titanium nitride layer. The titanium nitride and any unreacted titanium are then removed. An anneal on the order of 800–900° C. is then used to lower the sheet resistance and stabilize the titanium silicide phase (i.e., transform C49 phase titanium silicide to a lower resistance C54 phase). The lower resistance C54 phase of titanium silicide is preferred over the higher resistance C49 phase. Unfortunately, as device geometries shrink, it becomes more and more difficult to transform the C49 phase to the C54 phase. Therefore, it is very difficult to form a low sheet resistance titanium salicide for sub-0.25 μm CMOS technology. One proposed method to overcome this limitation is to use a pre-amorphization implant (PAI) prior to titanium deposition. The implant reduces the narrow linewidth effect and sheet resistances can be maintained below 10 ohms/[ ] for 0.2 μm N-type polysilicon gate linewidths. However, when the polysilicon gate linewidth drops below 0.16 μm, current silicide processes with a PAI result in many individual instances wherein the resistance is above 10 ohms/[ ]. Accordingly, there is a need to extend the usefulness of titanium-silicide to the sub-0.2 μm technologies.

SUMMARY OF THE INVENTION

A method of forming a silicided polysilicon line is disclosed herein. A first polysilicon layer is deposited. A thin oxide layer is formed over the first layer and a second polysilicon layer or a layer of amorphous silicon is deposited. A PAI is performed to create an amorphous region in the top layer. The structure is then silicided to form an overlying silicide layer that consumes a portion of the structure.

An advantage of the invention is forming a silicide on sub-0.2 μm polysilicon line that has a higher percentage of C54 phase silicide and, thus, lower sheet resistance.

This and other advantages will be apparent to those of ordinary skill in the art having reference to the specification in conjunction with the drawings.

DETAILED DESCRIPTION OF THE EMBODIMENTS

The invention will now be described in conjunction with the formation of a gate electrode for a MOSFET transistor. It will be apparent to those of ordinary skill in the art that the benefits of the invention may be applied to silicided polysilicon structures in general.

Figure 1:
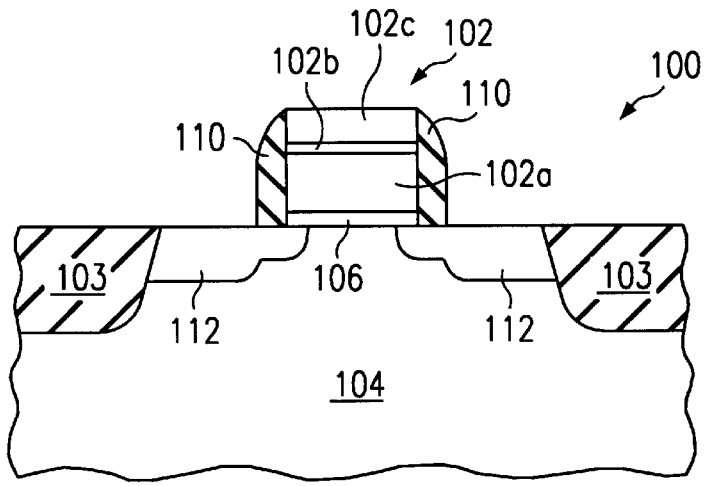
FIG. 1 is a cross-sectional diagram of a transistor having a gate electrode according to the invention prior to silicidation.

A cross-section of MOSFET 100 having a gate electrode 102 according to the invention, prior to silicidation, is shown in FIG. 1. MOSFET 100 is located in a semiconductor body 104. Isolation regions 103 isolate MOSFET 100 from other devices (not shown). The gate electrode 102 is formed over a gate dielectric 106. Sidewall spacers 110 are located on the sidewalls on the gate electrode 102. Source/drain regions 112, along with any drain extensions, are located in the semiconductor body on opposites sides of the gate electrode 102.

Gate electrode 102 comprises a stack of polysilicon 102a and amorphous silicon 102c with a very thin layer over oxide 102b in-between. The total combined thickness of the polysilicon 102a and amorphous silicon 102c is approximately equal to the total thickness that would be used for the polysilicon alone in a prior art approach. For example, polysilicon 102a may be on the order of 2000 Å thick and amorphous silicon 102c may be on the order of 500 Å thick. Amorphous silicon 102c may be created by a pre-amorphization implant (PAI) of either a deposited amorphous silicon or a deposited polysilicon. As will be discussed further below, a top portion of the polysilicon layer 102a may also be amorphized by the PAI implant. CAN THE BOTTOM POLY BE DEPOSITED AMORPHOUS SILICON AS WELL?

Thin oxide layer 102b is a very thin layer generally less than 8 Å. In fact, thin oxide layer 102b may be a sub-monatomic layer. The function of the thin oxide layer is to "poison" the surface or, in other words, disturb the grain growth. By disturbing the grain growth, the grain size remains relatively small. The oxide layer blocks, or at least delays, the re-crystallization of the amorphized region propagating from the unamorphized region DURING THE SILICIDE PROCESS?. Smaller grain size has been shown to result in a higher percentage of C54 phase silicide (i.e., low resistance silicide). ARE THERE TWO ADVANTAGES OF THE OXIDE LAYER—1—SMALLER GRAIN SIZE OF THE UPPER SILICON LAYER DURING DEPOSITION AND—2—PREVENTING RE-CRYSTALLIZATION DURING SUBSEQUENT PROCESSING, E.G. SOURCE/DRAIN ANNEAL AND SILICIDE REACT?

Figure 2A:
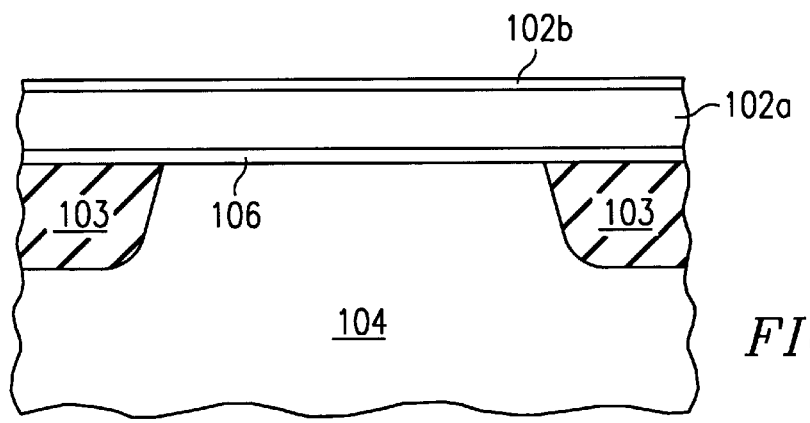
FIGS. 2A–2F are cross-sectional diagrams of the transistor of FIG. 1 at various stages of fabrication.

A method for forming MOSFET 100 according to the invention will now be discussed with reference to FIGS. 2A–2F. Referring to FIG. 2A, a semiconductor body 104 is processed through gate dielectric 106 formation. This includes ant threshold adjust implants and isolation region 103 formation. A first layer of polysilicon 102a is deposited over the gate dielectric 106. Polysilicon layer 102a may have a thickness on the order of 2000 Å.

After depositing polysilicon layer 102a, a very thin oxide layer 102b is formed over polysilicon layer 102a. Thin oxide layer 102b will generally be less than 8 Å and may be formed by simply exposing the polysilicon layer 102a to air. For example, the structure may be removed from the polysilicon deposition chamber and exposed to the atmosphere for a period of about 10 minutes. Alternatively, a thin oxide layer could be grown in-situ. This would allow a better cycle time. While it is currently difficult to grow a uniform thin oxide layer less than 10 Å, strict uniformity is not believed to be critical for this application. In fact, the thin oxide layer may be sub-monatomic, meaning not necessarily a continuous layer of oxide atoms. A monolayer of oxide is approximately 3.1 Å.

Figure 2B:
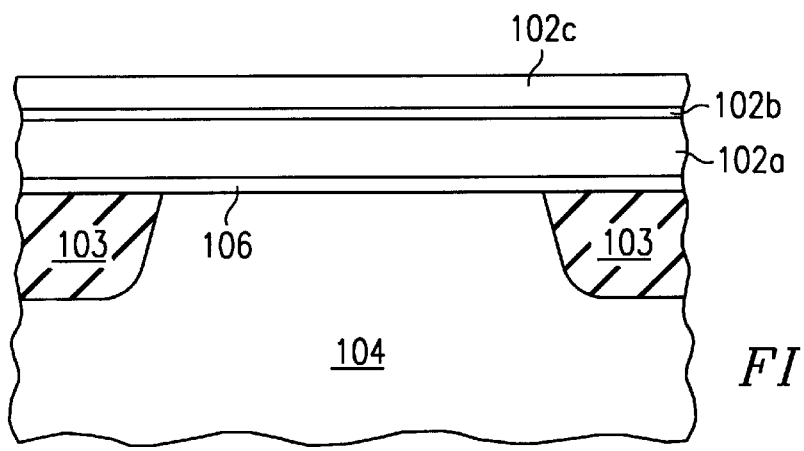

Referring to FIG. 2B, a layer of silicon material 102c is deposited over thin oxide layer 102b and polysilicon layer 102a. Silicon material 102c is preferably polysilicon. Alternatively, amorphous silicon may be used. Thin oxide layer 102b interferes with the grain growth during the deposition of silicon material 102c. Thus, silicon material 102c has a smaller grain size than a single polysilicon layer having a total thickness equal to that of layers 102a and 102b would have.

The thickness of silicon material 102c may be on the order of 500 Å. The thickness of the silicon material 102c and polysilicon layer 102a may vary depending on where the interface is desired. The total thickness of the polysilicon layer 102a and silicon material 102c should approximately equal what is used by the prior art for the polysilicon gate thickness, adjusted to the technology node desired. The depth of the interface (i.e., the thickness of the silicon material 102c) should be chosen such that the interface will be consumed during the subsequent silicide react process.

Figure 2C:
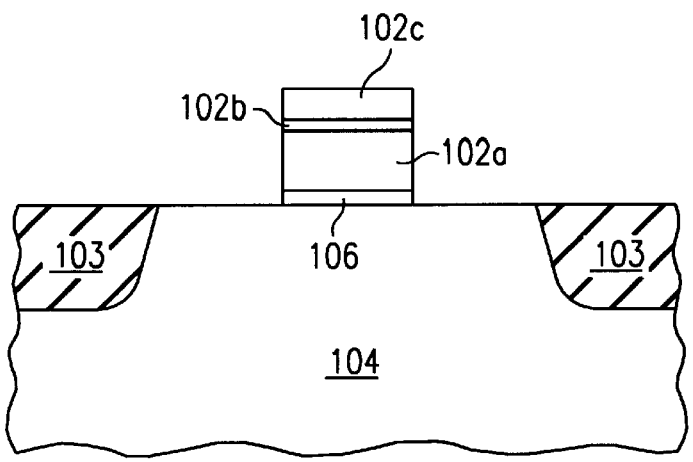

Referring to FIG. 2C, the polysilicon layer 102a, thin oxide 102b and silicon material 102c are patterned and etched to form the gate electrode 102. The invention is particularly useful for applications in which the width of the gate electrode 102 is less than 0.2 μm. The pattern is then removed.

Figure 2D:
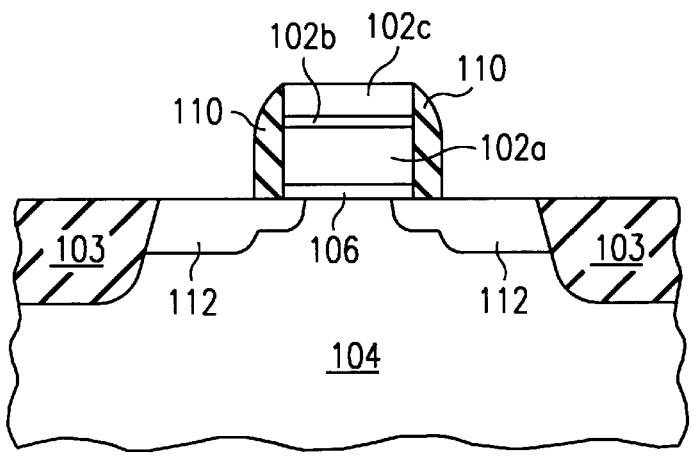

Sidewall spacers 110 are formed on the sidewalls of the gate electrode 102, as shown in FIG. 2D. Methods for forming sidewall spacers 110 are well known in the art. Then, source/drain regions 112 are implanted into semiconductor body 104. If source/drain regions 112 include drain extension regions as shown, the drain extension will have been implanted prior to sidewall spacer 110 formation.

Figure 2E:
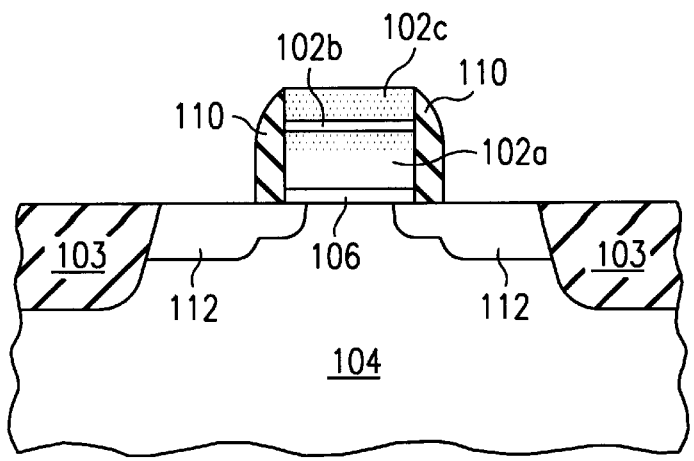

Referring to FIG. 2E, a PAI is performed to create an amorphous region in gate electrode 102. IS THE PAI BLOCKED FROM THE SOURCE/DRAIN REGION? I NEED A BETTER DESCRIPTION OF THE PAI IMPLANT—N-TYPE? DOPANT AT WHAT ENERGY AND DOSE? The energy and dose of the PAI are chosen such that the crystallinity of the silicon is damaged. The PAI extends into the gate electrode 102 to a depth preferably at or below the interface between layers 102a and 102c.

The PAI has been known to adversely affect the transistor off-current scatter. However, employing the interface between the polysilicon 102a and silicon material 102c according to the invention may allow for the implant to be decreased. DECREASED HOW—LESS FAR INTO THE POLYSILICON? In that case, the damage to the transistor can be minimized or even eliminated while maintaining the benefits of a PAI to silicide formation.

Figure 2F:
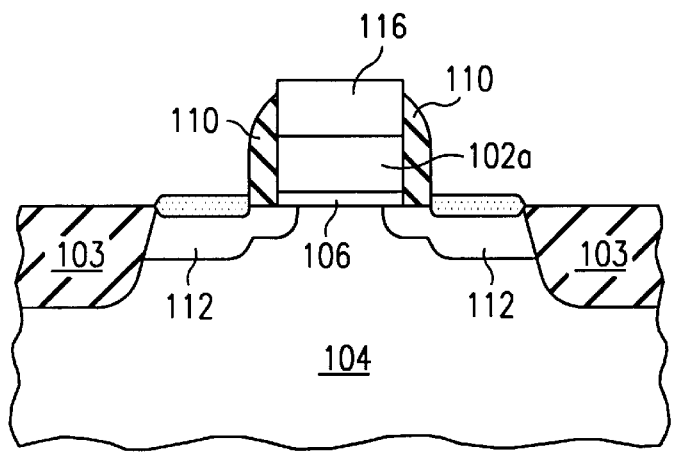

Referring to FIG. 2F, a silicidation process is carried out to form silicide layer 116. The process of forming silicide layer 116 consumes silicon material 102c, the thin oxide layer 102c at the interface and some portion of polysilicon layer 102a. A layer of titanium is deposited over silicon material 102c. A rapid thermal anneal (RTA) is then performed in an nitrogen ambient to react the titanium With the silicon in silicon material 102c to form the silicide 116. The titanium also reacts with the nitrogen in the ambient to form TiN over non-silicon areas and over the silicide. If source/drain regions 112 are exposed, they will be silicided as well. The TiN and any unreacted titanium are then removed. An anneal is performed to increased the transformation from a higher resistance C49 phase silicide to a lower resistance C54 phase silicide.

Figure 3:
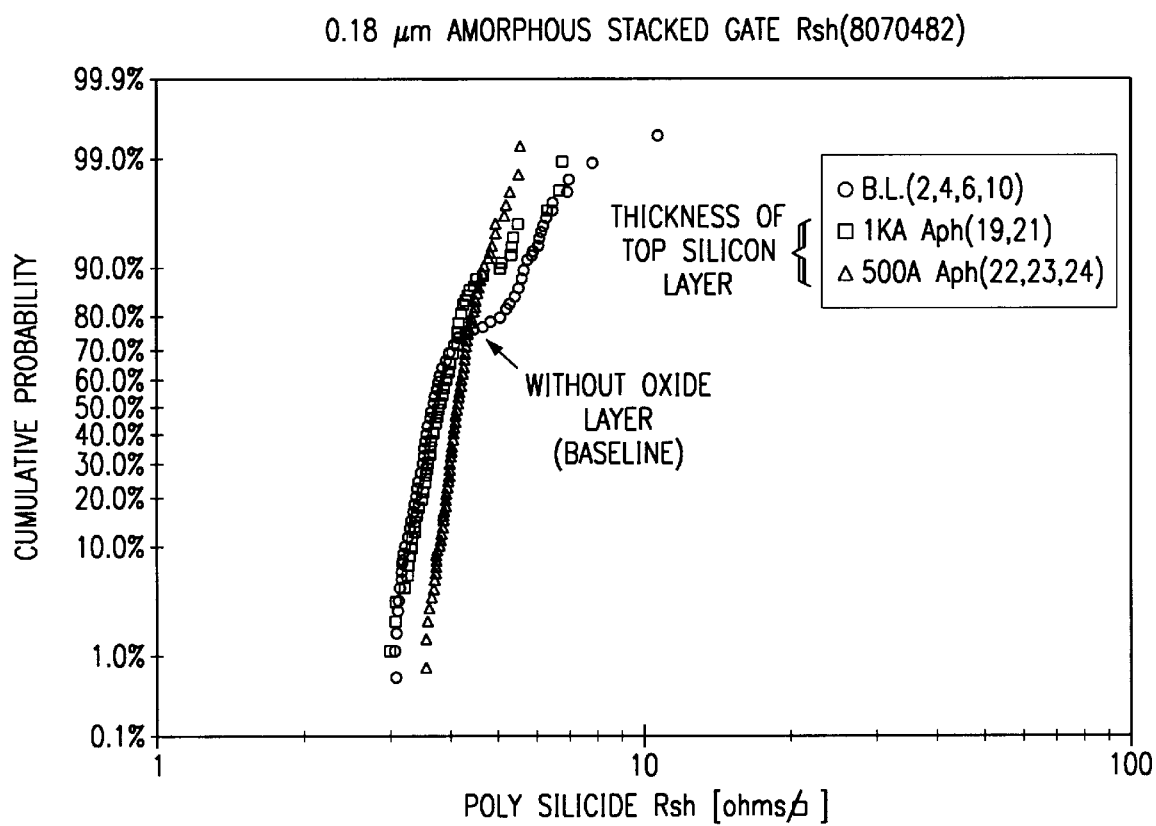
FIG. 3 is a graph of sheet resistances for several silicide processes.

In the resulting structure, no trace of oxygen is found at the former interface after silicidation. IS THERE ANY TRACE OF THE INTERFACE IN THE FINAL STRUCTURE—SOMETHING THAT WOULD MAKE THE INVENTION DETECTABLE? An advantage of the invention is that the sheet resistance becomes more uniform. Uniform sheet resistance is an advantage even if the average sheet resistance increases. FIG. 3 shows the poly-silicide sheet resistance of a 0.18 μm gate electrode for three processes. The first is a base line process (B.L.). There are many individual instances where the sheet resistance is above 10 ohms/[ ]. Variation in the sheet resistance is a problem. The second process uses a top amorphous layer (corresponding to 102c) of 1000 Å. There is less variation in the sheet resistance. The third process uses a top amorphous layer (102c) of 500 Å. Much less variation is observed. This process yielded the highest uniform distribution of sheet resistance.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for fabricating an integrated circuit, comprising the steps of:

forming a first silicon-containing layer over a semiconductor body;

forming a thin oxide over said first silicon-containing layer, said thin oxide having a thickness not greater than 8 Å;

forming a second silicon-containing layer over said thin oxide and said first silicon-containing layer;

performing a pre-amorphization implant to create an amorphous region in said second silicon-containing layer;

forming a refractory-metal over said second silicon-containing layer; and reacting said refractory metal with said second silicon-containing layer and a portion of said first silicon-containing layer to form a silicide layer.

2. The method of claim 1, wherein said first silicon-containing layer comprises polysilicon.

3. The method of claim 1, wherein said second silicon-containing layer comprises amorphous silicon.

4. The method of claim 1, wherein said second silicon-containing layer comprises polysilicon.

5. The method of claim 1, wherein said refractory metal comprises titanium.

6. The method of claim 1, wherein said reacting step occurs in a nitrogen ambient and also forms a refractory-metal-nitride.

7. The method of claim 6, further comprising the steps of:

removing said refractory metal nitride and any unreacted refractory metal; and annealing said silicide in a rapid thermal processor to lower the resistance of the silicide.

8. The method of claim 1, wherein said thin oxide is a sub-monatomic layer.

9. The method of claim 1, wherein said amorphous region created by said step of performing a pre-amorphization implant extends into said first silicon-containing layer.

10. A method for fabricating an integrated circuit, comprising the steps of:

forming a gate dielectric over a semiconductor body;

forming a first polysilicon layer over said gate dielectric;

forming a thin oxide over said first polysilicon layer, said thin oxide having a thickness not greater than 8 Å;

forming a second polysilicon layer over said thin oxide and said first polysilicon layer;

patterning and etching said first polysilicon layer, said thin oxide layer, and said second polysilicon layer to form a gate electrode;

performing a pre-amorphization implant to create an amorphous region in said second polysilicon layer;

forming a titanium layer over said second polysilicon layer; and reacting said titanium layer with said second polysilicon layer and a portion of said first polysilicon layer in a nitrogen ambient to form a silicide layer and a titanium nitride layer;

removing said titanium nitride and any unreacted portions of said titanium layer; and annealing said silicide layer in a rapid thermal processor to lower the resistance of said silicide.

11. The method of claim 10, wherein said thin oxide is a sub-monatomic layer.

12. The method of claim 10, wherein said amorphous region created by said step of performing a pre-amorphization implant extends into said first polysilicon layer.

13. The method of claim 10, further comprising the steps of:

forming sidewall spacers adjacent said gate electrode; and forming source/drain regions in said semiconductor body on opposite sides of said gate electrode; and wherein said reacting step also silicides said source/drain regions.

* * * * *

UNITED STATES PATENT AND TRADEMARK OFFICE
CERTIFICATE OF CORRECTION

PATENT NO. : 6,107,147
DATED : August 22, 2000
INVENTOR(S) : Kim et al.

It is certified that error appears in the above-identified patent and that said Letters Patent is hereby corrected as shown below:

Column 2,
Lines 42-44, canceling the sentence beginning at "CAN" and ending with "WELL?";
Lines 52-53, canceling the phrase "DURING THE SILICIDE PROCESS?".
Lines 55-61, canceling the sentence beginning at "ARE THERE" and ending at "REACT?" and inserting the sentence -- it should be considered whether there are two advantages of the oxide layer: 1) smaller grain size of the upper silicon layer during deposition and 2) preventing re-crystallization during subsequent processing, e.g., source/drain anneal and silicide react. --

Column 3,
Lines 50-54, canceling the sentences beginning at "IS THE" and ending at "DOSE" and inserting -- it should be considered whether to block the PAI implant from the source/drain region and at what energy and dose to use for the PAI implant. --
Lines 62-63, canceling the sentence beginning at "DECREASED" and ending at "POLYSILICON?".

Column 4,
Lines 15-18, canceling the sentence beginning at "IS THERE" and ending at "DETECTABLE?".

Signed and Sealed this

Fourteenth Day of January, 2003

JAMES E. ROGAN
*Director of the United States Patent and Trademark Office*